(12) United States Patent
Rughoonundon et al.

(10) Patent No.: US 8,736,377 B2
(45) Date of Patent: May 27, 2014

(54) RF PULSE EDGE SHAPING

(71) Applicant: MKS Instruments, Inc., Andover, MA (US)

(72) Inventors: Amish Rughoonundon, Pittsford, NY (US); Larry J. Fisk, II, Fairport, NY (US); Aaron T. Radomski, Wyoming, NY (US)

(73) Assignee: MKS Instruments, Inc., Andover, MA (US)

( * ) Notice: Subject to any disclaimer, the term of this patent is extended or adjusted under 35 U.S.C. 154(b) by 63 days.

(21) Appl. No.: 13/663,574

(22) Filed: Oct. 30, 2012

(65) Prior Publication Data

US 2014/0118031 A1     May 1, 2014

(51) Int. Cl.
    *H03F 3/04*     (2006.01)
(52) U.S. Cl.
    USPC .......................................... 330/296; 330/285
(58) Field of Classification Search
    USPC .......................................... 330/296, 285, 10
    See application file for complete search history.

(56) References Cited

U.S. PATENT DOCUMENTS

| | | | | |
|---|---|---|---|---|
| 4,372,315 | A * | 2/1983 | Shapiro et al. | 606/36 |
| 5,548,291 | A * | 8/1996 | Meier et al. | 340/10.34 |
| 8,659,335 | B2 * | 2/2014 | Nagarkatti et al. | 327/181 |
| 2008/0179948 | A1 * | 7/2008 | Nagarkatti et al. | 307/18 |

* cited by examiner

*Primary Examiner* — Henry Choe
(74) *Attorney, Agent, or Firm* — Harness, Dickey & Pierce, P.L.C.

(57) ABSTRACT

A radio frequency (RF) generation module includes a power control module that receives first and second desired amplitudes of an output of the RF generation module in first and second respective states, and that outputs, based on the first and second desired amplitudes, input power setpoints corresponding to a transition from the first state to the second state. A frequency control module receives the input power setpoints and outputs frequency setpoints corresponding to the input power setpoints. A pulse shaping module receives the input power setpoints, the frequency setpoints, and an indication of when to transition from the first state to the second state, and transitions the output of the RF generation module from the first state to the second state based on the input power setpoints, the frequency setpoints, and the indication.

18 Claims, 4 Drawing Sheets

RF PULSE EDGE SHAPING

FIELD

The present disclosure relates to RF power systems, and more specifically to pulse edge shaping of an output of an RF power system.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma etching is frequently used in, for example only, semiconductor fabrication. In plasma etching, ions are accelerated by an electric field to etch exposed surfaces on a substrate. The electric field is generated according to RF power signals generated by a radio frequency (RF) generator of an RF power system. The RF power signals generated by the RF generator are precisely controlled to effectively perform the plasma etching.

An RF power system may include an RF generator, a matching network, and a load, such as a plasma chamber. The RF power signals are used to drive the load to fabricate various components including, but not limited to, integrated circuits (ICs), solar panels, compact disks (CDs), and/or digital versatile (or video) discs (DVDs). The load may include any of a number of elements or devices driven by an RF signal, including, but not limited to, the plasma chamber. The load may include broadband mismatched loads (e.g., cables with mismatched resistor terminations), narrowband mismatched loads (e.g., a 2-element matching network), and resonator loads.

The RF power signals are received at the matching network. The matching network matches an input impedance of the matching network to a characteristic impedance of a transmission line between the RF generator and the matching network. This impedance matching aids in minimizing an amount of power applied to the matching network in a forward direction toward the plasma chamber ("forward power") and reflected back from the matching network to the RF generator ("reverse power"). Impedance matching also assists in maximizing forward power output from the matching network to the plasma chamber.

There are various approaches to applying the RF signal to the load. One example approach is to apply a continuous wave signal to the load. The continuous wave signal is typically a sinusoidal wave that is output continuously by an RF power supply to the load. In the continuous wave approach, the RF signal assumes a sinusoidal output, and the amplitude and/or frequency of the sinusoidal wave can be varied in order to vary the output power applied to the load. Another example approach to applying the RF signal to the load involves pulsing the RF signal, rather than applying a continuous wave signal to the load.

SUMMARY

A radio frequency (RF) generation module includes a power control module that receives first and second desired amplitudes of an output of the RF generation module in first and second respective states, and that outputs, based on the first and second desired amplitudes, input power setpoints corresponding to a transition from the first state to the second state. A frequency control module receives the input power setpoints and outputs frequency setpoints corresponding to the input power setpoints. A pulse shaping module receives the input power setpoints, the frequency setpoints, and an indication of when to transition from the first state to the second state, and transitions the output of the RF generation module from the first state to the second state based on the input power setpoints, the frequency setpoints, and the indication.

A method for operating a radio frequency (RF) generation module includes receiving first and second desired amplitudes of an output of the RF generation module in first and second respective states, outputting, based on the first and second desired amplitudes, input power setpoints corresponding to a transition from the first state to the second state, outputting frequency setpoints corresponding to the input power setpoints, receiving the input power setpoints, the frequency setpoints, and an indication of when to transition from the first state to the second state, and transitioning the output of the RF generation module from the first state to the second state based on the input power setpoints, the frequency setpoints, and the indication.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Pulses generated by an RF generator may be tuned individually or not tuned. For example, only a high side of a pulse may be tuned or no portion of the pulse may be tuned. Consequently, tuning can be slow and may not achieve a target before the pulse changes, thereby limiting either the impedance match or the pulse rate, or necessitating very fast tuning.

An RF generation module according to the present disclosure minimizes reflected power for multiple different power levels while pulsing and minimizing reflected power for multiple different loads caused by pulsed plasma, reduces oscillations caused by sudden power transitions, and increases control over delivered energy. For example, the RF generation module implements one or more power control modules and one or more frequency control modules. The power control module and the frequency control module control a number of discrete states required by a particular process. The power control module and the frequency control module transition an RF output signal of the RF generation module between first and second states (e.g., generate an RF pulse). However, instead of controlling an instantaneous transition between the first state and the second state, power and frequency are controlled to transition between the first state and the second state, and/or from the second state to the first state, in a step-wise fashion (i.e., over a plurality of respective power and frequency setpoints).

For example, the RF generator module may pulse between power setpoints, (e.g., PDEL(0) and PDEL(1), . . . , and PDEL(n)) for a transition from the first state to the second state. Similarly, the RF generator module maintains a different RF frequency set point for each of the power setpoints (e.g., f(0), f(1), . . . , and f(n)). When a pulse change occurs, both the RF power and RF frequency are gradually changed between the range of power and frequency setpoints over a first period. In this manner, the RF generator module shapes edges of the RF pulse according to a variety of desired edge shapes instead of merely generating a square wave pulse. For example only, edges of the RF pulse may be shaped based on desired power level, voltage, or current, or any other suitable input.

Figure 1:
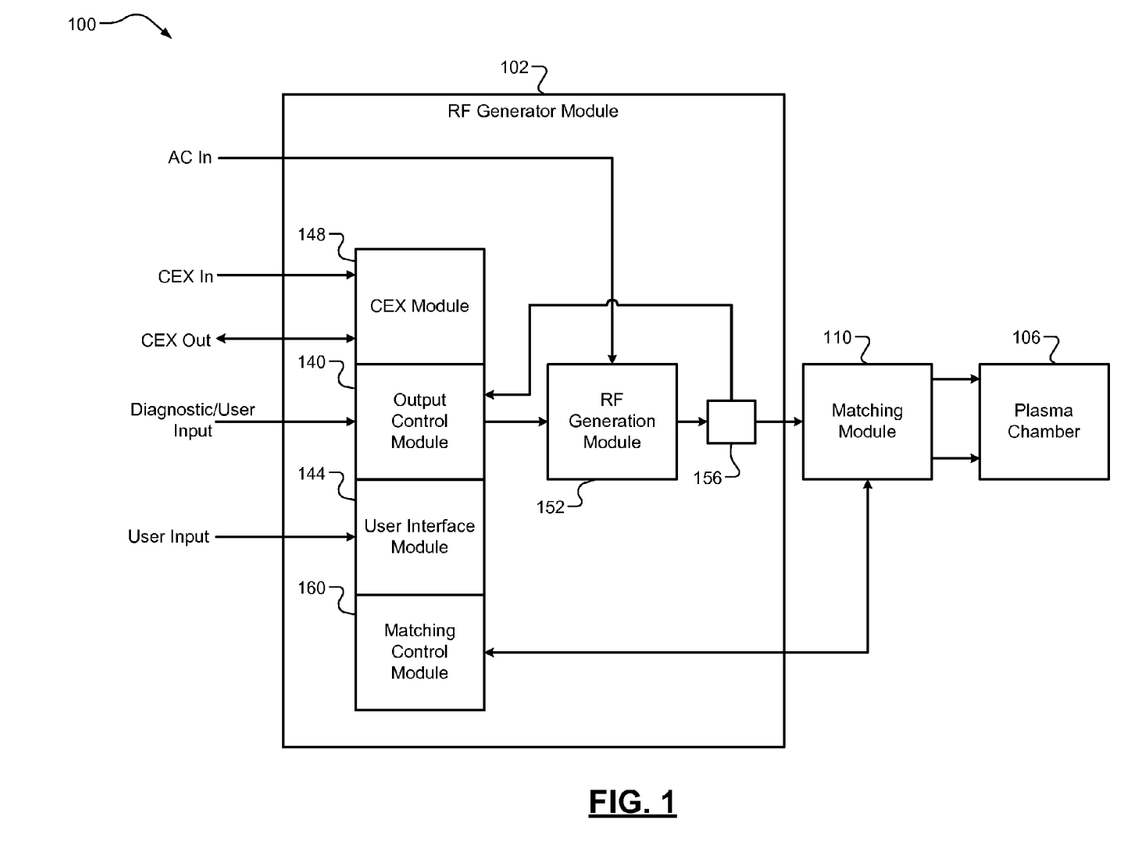
FIG. 1 is a functional block diagram of an exemplary radio frequency (RF) plasma chamber system according to the principles of the present disclosure.

Referring now to FIG. 1, a functional block diagram of an exemplary implementation of an exemplary radio frequency (RF) plasma chamber system 100 is presented. While FIG. 1 illustrates a dual-channel RF plasma chamber system, the principles of the present disclosure apply to RF generator systems including two or more channels.

An RF generator module 102 (e.g., an RF generator) receives alternating current (AC) input power and generates RF outputs using the AC input power. For example only, the AC input power may be three-phase AC power of approximately 480 Volts AC (VAC) or another suitable voltage. For purposes of discussion only, the RF generator module 102 will be hereafter discussed as generating two RF outputs (i.e., the RF generator module 102 is described as a dual-channel RF generator module). However, the RF generator module 102 may generate a greater number of RF outputs, or may only generate a single RF output. For example only, the RF generator module 102 may generate one RF output per plasma electrode implemented in one or more plasma chambers, such as plasma chamber 106.

A matching module 110 receives the RF outputs and impedance matches each of the RF outputs before providing the RF outputs to the plasma chamber 106. The RF generator module 102 may control the matching module 110. More specifically, the RF generator module 102 may control the extent to which the matching module 110 performs impedance matching.

The matching module 110 applies the RF outputs to plasma electrodes, respectively, implemented within the plasma chamber 106. Application of the RF outputs to the plasma electrodes may be performed, for example, in thin film deposition systems, thin film etching systems, and in other suitable. RF outputs may also be used in other suitable systems.

The RF generator module 102 may include an output control module 140, a user interface module 144, a common excitation (CEX) module 148, and an RF generation module 152. The RF generator module 102 may also include a sensor module 156 and a matching control module 160.

The output control module 140 receives an input power setpoint for the RF outputs that are generated by the RF generation module 152 (P Set) and that are delivered to the plasma electrodes. The input power setpoint may be provided by, for example, the user interface module 144 or another suitable source. Another suitable source of the input power setpoint may include, for example, a diagnostic or user input provided via a universal standard (US) 232 connection, via an ethernet connection, via a wireless connection, or via a front panel input. An external source (not shown) may input an RF signal (CEX In) that may be used by the output control module 140. The RF signal may also be output or made available for input or output by the CEX module 148 (CEX Out). For example only, the RF signal may be output to one or more other RF generator modules that generate RF outputs for one or more other plasma chambers (not shown).

The sensor module 156 may measure voltage and current of the RF output generated by the RF generation module 152. The sensor module 156 may provide signals indicating the voltage and current, respectively, to the output control module 140. For example only, the sensor module 156 may include a directional coupler or VI probe, or another suitable type of sensor. In other implementations, the sensor module 156 may output signals indicative of first and second forward and reverse powers associated with the RF output. A forward power may refer to an amount of power leaving the RF generator module 152. A reverse power may refer to an amount of power reflected back to the RF generator module 152. The output of the sensor module 156 may be referred to as a feedback signal. The feedback signal may be a digital signal or an analog signal.

Based on the feedback signal from the sensor module 156, the output control module 140 may determine a forward power for the RF output. The output control module 140 may also determine a reflection coefficient based on the feedback signal output by the sensor module 156.

The output control module 140 controls the generation of the first and second RF outputs using a feedback approach based on the first and second forward powers and the first and second reflection coefficients, respectively. More specifically, the output control module 140 provides one or more rail voltage setpoints and/or one or more driver control signals to the RF generation module 152. The RF generation module 152 controls one or more rail voltages (i.e., voltages output from the RF generation module 152 and input to power amplifiers) based on the rail voltage setpoints and controls driving of power amplifiers based on the driver control signals.

The RF generation module 152 implements RF pulse edge shaping according to the principles of the present disclosure. For example, the RF generation module 152 may receive one or more inputs including, but not limited to, the rail voltage setpoints and driver control signals, a pulse pattern, outputs of various pulse sources, and/or indications of when to transition between first and second pulse states. The RF generation module 152 receives (and/or, generate) a plurality of input power setpoints and frequency setpoints. The RF generation module 152 generates outputs according to, for example only, the one or more inputs (e.g., the indications of when to transition between the first and second pulse states), the input power setpoints, and the frequency setpoints.

Referring now to FIGS. 2, 3A, 3B, and 3C, an example RF generation module 200 generates an output 204 including pulses such as pulses 208-1, 208-2, and 208-3, referred to collectively as pulses 208. The RF generation module 200 transitions the pulses 208 from a first state (e.g., state 0) to a second state (e.g., state 1), and from the second state to the first state. The pulses 208 may include one or more intermediate states (e.g., state n) between the first state and the second state. The first state may correspond to a first input power setpoint (e.g., PDEL(0)) and a corresponding first frequency setpoint (e.g., f(0)). Conversely, the second state may correspond to a second input power setpoint (e.g., PDEL(1)) and a corresponding second frequency setpoint (e.g., f(1)).

Over a first transition period 212 between the first state and the second state, the input power setpoint may be adjusted (e.g., in steps) from PDEL(0) to PDEL(1). For example, the input power setpoint may be adjusted according to an incremental offset (i.e., a plurality of intermediate setpoints between PDEL(0) and PDEL(1)) over the first transition period 212. Similarly, the frequency setpoint may be adjusted in steps from f(0) to f(1) through a plurality of intermediate setpoints over the first transition period 212. Conversely, the input power setpoint and the frequency setpoint may be adjusted from PDEL(1) to PDEL(0) and from f(1) to f(0), respectively, through the plurality of intermediate setpoints over a second transition period 216. The first transition period 212 and 216 may be the same or different, and may be the same or different for different pulse types.

Incrementally adjusting the input power and frequency setpoints in this manner allows the RF generation module 200 to shape edges of the pulses 208. For example, the pulse 208-1 is controlled to have exponential pulse edges. The pulse 208-2 is controlled to have linear pulse edges. The pulse 208-3 is controlled to have rounded pulse edges. Various other pulse edge shapes may be controlled with the RF generation module 200. For example only, adjusting the input power and frequency setpoints changes the pulse edge shapes (i.e., the ramp) of the pulses 208 without changing an overall width of the pulses 208.

Figure 2:
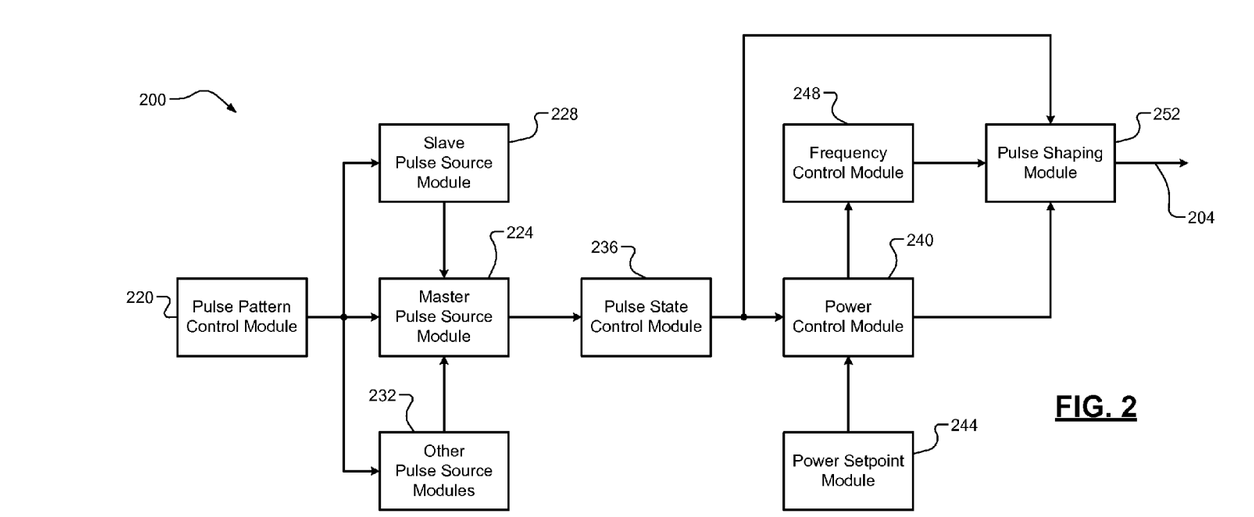
FIG. 2 is a functional block diagram of an RF generation module according to the principles of the present disclosure.
Figures 3A, 3B:
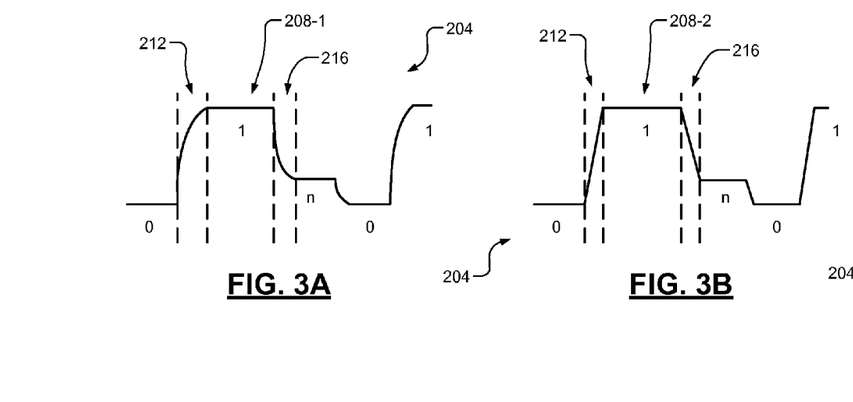
FIGS. 3A, 3B, and 3C illustrate outputs having different pulse shapes according to the principles of the present disclosure.
Figure 3C:
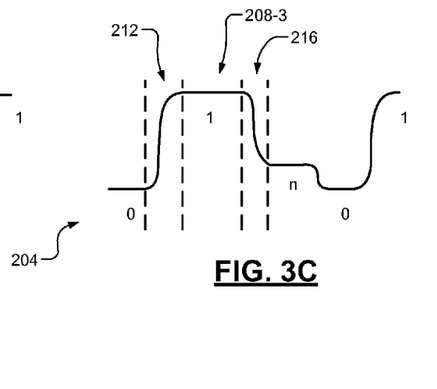

A pulse pattern control module 220 determines a desired pulse frequency (e.g., an overall pulse frequency) for the output 204 and a duty cycle corresponding to, for example, a desired pulse pattern. The desired pulse frequency and duty cycle provide an indication of when to transition from the first state to the second state, and from the second state to the first state. The pulse pattern control module 220 may communicate with a master pulse source module 224, one or more slave pulse source modules 228, and/or other pulse source modules 232. For example only, the pulse pattern control module 220 and the pulse source modules 224, 228, and 232 may operate in part according to inputs received from the output control module 140.

A pulse state control module 236 generates an output indicative of a desired amplitude of the output 204 in the first state and the second state, and the indication of when to transition between the first and second states. A power control module 240 receives the output from the pulse state control module 236, and one or more signals indicative of the input power setpoints from a power setpoint module 244. For example only, the power setpoint module 244 may store predetermined input power setpoints, and/or may implement a user interface to receive user selected input power setpoints. The power control module 240 may also receive an indication of a desired pulse shape (e.g., from the pulse state control module 236) corresponding to, for example only, one of the pulses shown in FIGS. 3A, 3B, and 3C. The desired pulse shape may determine the input power setpoints received from the power setpoint module 244.

The power control module 240 communicates an indication of the input power setpoints to a frequency control module 248 and a pulse shaping module 252 based on, for example, the desired amplitude and the desired pulse shape. For example only, the indication communicated from the power control module 240 may include a power setpoint corresponding to the first state (e.g., PDEL(0)), a power setpoint corresponding to the second state (e.g., PDEL(1)), and a step size corresponding to an incremental offset between each of the intermediate setpoints between the first state and the second state.

Conversely, the frequency control module 248 may determine frequency setpoints corresponding to the input power setpoints. Or, the frequency control module 248 may store predetermined frequency setpoints corresponding to various input power setpoints. The frequency control module 248 communicates an indication of the frequency setpoints to the pulse shaping module 252. For example only, the indication communicated from the frequency control module 248 may include a frequency setpoint corresponding to the first state (e.g., f(0)), a power setpoint corresponding to the second state (e.g., f(1)), and a step size corresponding to an incremental offset between each of the intermediate setpoints between the first state and the second state. The pulse shaping module 252 generates the output 204 having a desired type of pulse based on the outputs of the pulse state control module 236, the power control module 240, and the frequency control module 248.

Figure 4:
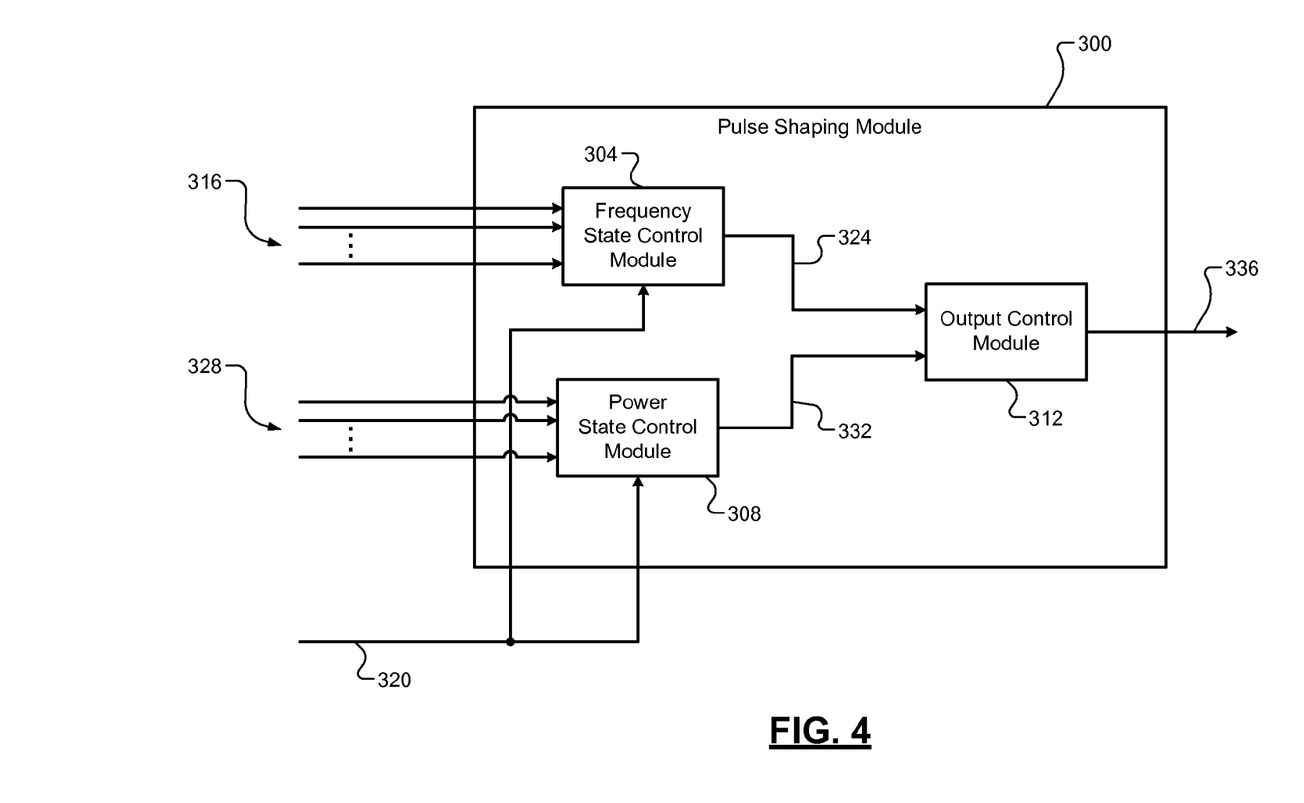
FIG. 4 is a functional block diagram of a pulse shaping module according to the principles of the present disclosure.

Referring now to FIG. 4, an example pulse shaping module 300 includes a frequency state control module 304, a power state control module 308, and an output control module 312. The frequency state control module 304 receives a plurality of input signals 316 indicating, for example, a first state (state 0) frequency setpoint, a first state step size (e.g., indicating a step size for transitioning frequency from the first state to the second state), a second state (state 1) frequency setpoint, and a second state step size (e.g., indicating a step size for transitioning frequency from the first state to the second state). Although described as a first state step size, the first state and/or the second state may also correspond to, for example only, a number of steps, a step time, and/or a total ramp time for transitioning frequency from the first state to the second state. The input signals 316 may also indicate whether to transition between the first state and the second state gradually (i.e., whether to ramp between the first state and the second state), or to transition instantaneously. The frequency state control module 304 also receives a pulse signal 320 indicating when to transition between the first and second states. The frequency state control module 304 outputs a frequency control signal 324 based on the input signals 316 and the pulse signal 320.

The power state control module 308 receives a plurality of input signals 328 indicating, for example, a first state (state 0) power setpoint, a first state step size (e.g., indicating a step size for transitioning power from the first state to the second state), a second state (state 1) power setpoint, and a second state step size (e.g., indicating a step size for transitioning power from the first state to the second state). Although described as a first state step size, the first state and/or the second state may also correspond to, for example only, a number of steps, a step time, and/or a total ramp time for transitioning power from the first state to the second state. The input signals 328 may also indicate whether to transition between the first state and the second state gradually (i.e., whether to ramp between the first state and the second state), or to transition instantaneously. The power state control module 308 also receives the pulse signal 320 indicating when to transition between the first and second states. The power state control module 308 outputs a power control signal 332 based on the input signals 328 and the pulse signal 320.

The output control module 312 receives the frequency control signal 324 and the power control signal 332. The output control module 312 generates an output 336 having pulses shaped according to the frequency control signal 324 and/or the power control signal 332.

Figure 5:
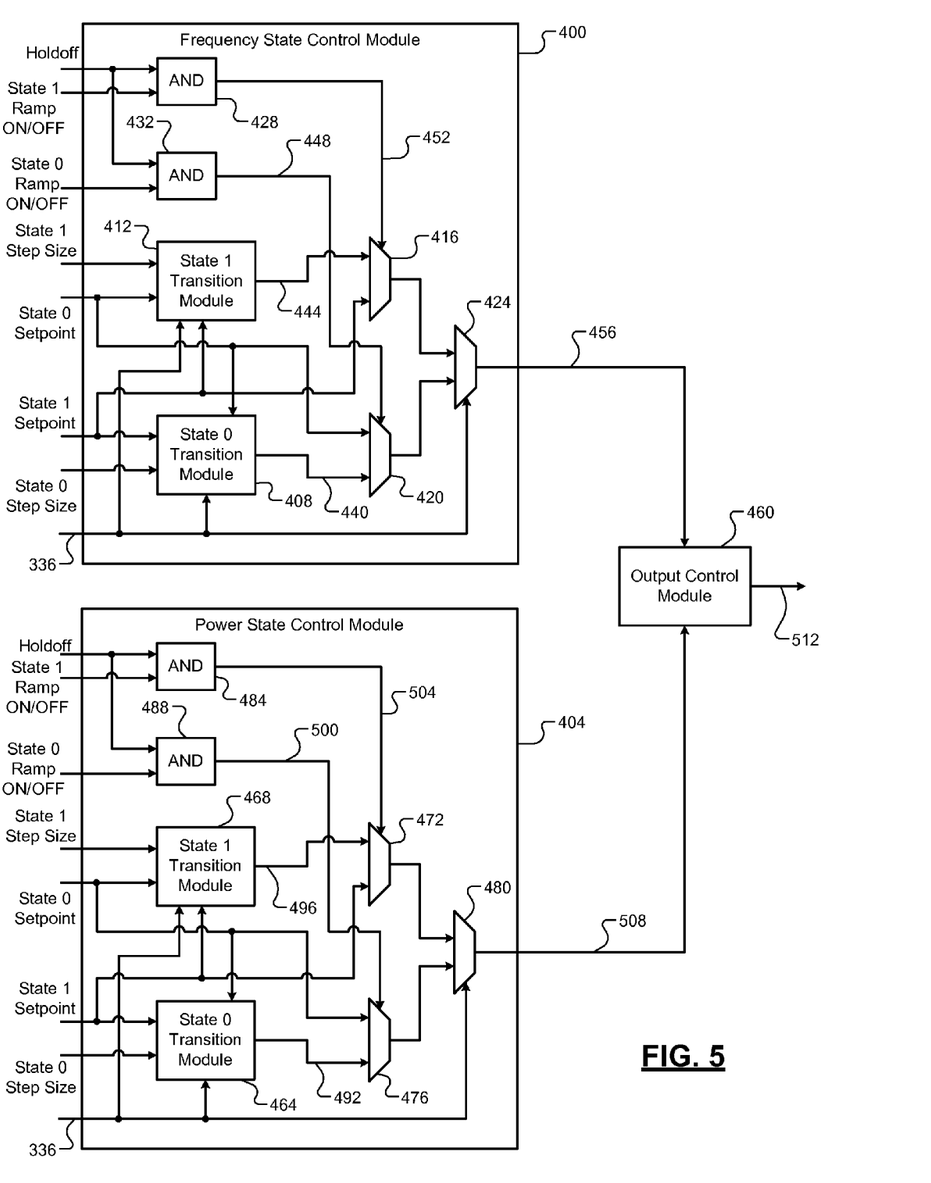
FIG. 5 is a functional block diagram of a frequency state control module and a power state control module according to the principles of the present disclosure.

Referring now to FIG. 5, an example frequency state control module 400 and an example power state control module 404 are shown in more detail. The frequency state control module 400 includes a state 0 transition module 408, a state 1 transition module 412, multiplexers 416, 420, and 424, and logical AND modules 428 and 432. The state 0 transition module 408 receives a state 0 frequency setpoint and a state 0 step size and transitions from the state 1 frequency to the state 0 frequency according to the state 0 step size (or, the state 0 number steps, step time, and/or total ramp time). For example, the state 0 transition module 408 iteratively uses the state 0 step size (or, the state 0 number steps, step time, and/or total ramp time) to transition to the state 0 frequency in response to a pulse signal 336. The state 0 transition module 408 receives a state 0 frequency setpoint and clamps to the state 0 frequency setpoint when the transition from the state 1 frequency setpoint to the state 0 frequency setpoint is complete. The state 0 transition module 408 outputs a transition frequency signal 440.

The state 1 transition module 412 receives the state 1 frequency setpoint and the state 1 step size and transitions from the state 0 frequency to the state 1 frequency according to the state 1 step size (or, the state 1 number of steps, step time, and/or total ramp time). For example, the state 1 transition module 412 iteratively uses the state 1 step size (or, the state 1 number of steps, step time, and/or total ramp time) to transition to the state 1 frequency in response to the pulse signal 336. The state 1 transition module 412 receives the state 1 frequency setpoint and clamps to the state 1 frequency setpoint when the transition from the state 0 frequency setpoint to the state 1 frequency setpoint is complete. The state 1 transition module 412 outputs a transition frequency signal 444.

The multiplexer 420 outputs either the transition frequency signal 440 or the state 0 frequency setpoint according to a selection signal 448 received from the logic AND module 432. The logic AND module 432 receives a sate 0 ramp ON/OFF signal indicating whether to ramp from the state 1 and the state 0, and a holdoff signal. For example, the holdoff signal may indicate whether pulse edge shaping is enabled according to one or more other conditions of the system. Accordingly, if the state 0 ramp ON/OFF signal is OFF or the holdoff signal indicates that pulse edge shaping is not enabled, the multiplexer 420 outputs the state 0 frequency setpoint instead of the transition frequency signal 440.

The multiplexer 416 outputs either the transition frequency signal 444 or the state 1 frequency setpoint according to a selection signal 452 received from the logic AND module 428. The logic AND module 428 receives a state 1 ramp ON/OFF signal indicating whether to ramp from the state 0 to the state 1, and the holdoff signal. Accordingly, if the state 1 ramp ON/OFF signal is OFF or the holdoff signal indicates that pulse edge shaping is not enabled, the multiplexer 416 outputs the state 1 frequency setpoint instead of the transition frequency signal 444. The multiplexer 424 outputs either the signal selected by the multiplexer 416 or the signal selected by the multiplexer 420 based on the pulse signal 336 and outputs a frequency control signal 456 to an output control module 460 accordingly.

The power state control module 404 includes a state 0 transition module 464, a state 1 transition module 468, multiplexers 472, 476, and 480, and logical AND modules 484 and 488. The state 0 transition module 464 receives a state 0 power setpoint and a state 1 step size and transitions between the state 0 power and the state 1 power according to the state 1 step size. For example, the state 0 transition module 464 iteratively adds the state 1 step size to the state 0 power to transition to the state 1 power in response to the pulse signal 336. The state 0 transition module 464 receives a state 1 power setpoint and clamps to the state 1 power setpoint when the transition from the state 0 power setpoint to the state 1 power setpoint is complete. The state 0 transition module 464 outputs a first transition power signal 492.

The state 1 transition module 468 receives the state 1 power setpoint and the state 0 step size and transitions between the state 1 power and the state 0 power according to the state 0 step size. For example, the state 1 transition module 468 iteratively adds the state 0 step size to the state 1 power to transition to the state 0 power in response to the pulse signal 336. The state 1 transition module 468 receives the state 0 power setpoint and clamps to the state 0 power setpoint when the transition from the state 1 power setpoint to the state 0 power setpoint is complete. The state 1 transition module 468 outputs a second transition power signal 496.

The multiplexer 476 outputs either the transition power signal 492 or the state 0 power setpoint according to a selection signal 500 received from the logic AND module 488. The logic AND module 488 receives a falling ramp ON/OFF signal indicating whether to ramp between the state 1 and the state 0, and a holdoff signal. Accordingly, if the falling ramp ON/OFF signal is OFF or the holdoff signal indicates that pulse edge shaping is not enabled, the multiplexer 476 outputs the state 0 power setpoint instead of the transition power signal 492.

The multiplexer 472 outputs either the transition power signal 496 or the state 1 power setpoint according to a selection signal 504 received from the logic AND module 484. The logic AND module 484 receives a rising ramp ON/OFF signal indicating whether to ramp between the state 0 and the state 1, and the holdoff signal. Accordingly, if the rising ramp ON/OFF signal is OFF or the holdoff signal indicates that pulse edge shaping is not enabled, the multiplexer 472 outputs the state 1 power setpoint instead of the transition power signal 496. The multiplexer 480 outputs either the signal selected by the multiplexer 472 or the signal selected by the multiplexer 476 based on the pulse signal 336 and outputs a power control signal 508 to the output control module 460 accordingly. The output control module 460 generates an output 512 having pulses shaped according to the frequency control signal 456 and the power control signal 508.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a systemon-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:

1. A radio frequency (RF) generation module, comprising:
   a power control module that receives first and second desired amplitudes of an output of the RF generation module in first and second respective states, and that outputs, based on the first and second desired amplitudes, input power setpoints corresponding to a transition from the first state to the second state;
   a frequency control module that receives the input power setpoints and outputs frequency setpoints corresponding to the input power setpoints; and
   a pulse shaping module that receives the input power setpoints, the frequency setpoints, and an indication of when to transition from the first state to the second state, and that transitions an output signal from the first state to the second state based on the input power setpoints, the frequency setpoints, and the indication.

2. The RF generation module of claim 1, wherein:
   the input power setpoints include a first power setpoint corresponding to the first state, a second power setpoint corresponding to the second state, and at least one of a step size, a number of steps, a step time, and a ramp time for transitioning between the first power setpoint and the second power setpoint; and
   the frequency setpoints include a first frequency setpoint corresponding to the first state, a second frequency setpoint corresponding to the second state, and at least one of a step size, a number of steps, a step time, and a ramp time for transitioning between the first frequency setpoint and the second frequency setpoint.

3. The RF generation module of claim 1, wherein the input power setpoints are at least one of i) predetermined and stored in the RF generation module and ii) received as inputs from a user interface.

4. The RF generation module of claim 1, further comprising:
   a pulse state control module that outputs the first and second desired amplitudes and the indication based on at least one of a desired pulse frequency and a desired duty cycle.

5. The RF generation module of claim 4, wherein:
   the pulse state control module further outputs a desired pulse shape to at least one of the power control module and the pulse shaping module.

6. The RF generation module of claim 1, wherein at least one of the input power setpoints and the frequency setpoints are further based on a desired pulse shape of the output of the RF generation module.

7. The RF generation module of claim 6, wherein the desired pulse shape includes at least one of exponential pulse edges, linear pulse edges, and rounded pulse edges.

8. The RF generation module of claim 6, wherein the desired pulse shape does not change a desired pulse width of the output of the RF generation module.

9. The RF generation module of claim 1, wherein the pulse shaping module further comprises:
   a frequency state control module that outputs a frequency control signal based on the frequency setpoints;
   a power state control module that outputs a power control signal based on the input power setpoints; and
   an output module that outputs the output of the RF generation module having pulses shaped according to the frequency control signal and the power control signal.

10. A method for operating a radio frequency (RF) generation module, the method comprising:
    receiving first and second desired amplitudes of an output of the RF generation module in first and second respective states;
    outputting, based on the first and second desired amplitudes, input power setpoints corresponding to a transition from the first state to the second state;
    outputting frequency setpoints corresponding to the input power setpoints;
    receiving the input power setpoints, the frequency setpoints, and an indication of when to transition from the first state to the second state; and
    transitioning the output of the RF generation module from the first state to the second state based on the input power setpoints, the frequency setpoints, and the indication.

11. The method of claim 10, wherein:
    the input power setpoints include a first power setpoint corresponding to the first state, a second power setpoint corresponding to the second state, and at least one of a step size, a number of steps, a step time, and a ramp time for transitioning between the first power setpoint and the second power setpoint; and
    the frequency setpoints include a first frequency setpoint corresponding to the first state, a second frequency setpoint corresponding to the second state, and at least one of a step size, a number of steps, a step time, and a ramp time for transitioning between the first frequency setpoint and the second frequency setpoint.

12. The method of claim 10, wherein the input power setpoints are at least one of i) predetermined and stored in the RF generation module and ii) received as inputs from a user interface.

13. The method of claim 10, further comprising:
    outputting the first and second desired amplitudes and the indication based on at least one of a desired pulse frequency and a desired duty cycle.

14. The method of claim 13, further comprising:
    outputting a desired pulse shape.

15. The method of claim 10, wherein at least one of the input power setpoints and the frequency setpoints are further based on a desired pulse shape of the output of the RF generation module.

16. The method of claim 15, wherein the desired pulse shape includes at least one of exponential pulse edges, linear pulse edges, and rounded pulse edges.

17. The method of claim 15, wherein the desired pulse shape does not change a desired pulse width of the output of the RF generation module.

18. The method of claim 10, further comprising:
- outputting a frequency control signal based on the frequency setpoints;
- outputting a power control signal based on the input power setpoints; and
- outputting the output of the RF generation module having pulses shaped according to the frequency control signal and the power control signal.

* * * * *